(12) United States Patent
Ametani (10) Patent No.: US 7,757,741 B2
(45) Date of Patent: *Jul. 20, 2010

(54) APPARATUS FOR ATTACHING A PEELING TAPE

(75) Inventor: Minoru Ametani, Hachioji (JP)

(73) Assignee: Tokyo Seimitsu Co., Ltd., Mitaka-shi (JP)

( * ) Notice: Subject to any disclaimer, the term of this patent is extended or adjusted under 35 U.S.C. 154(b) by 802 days.

This patent is subject to a terminal disclaimer.

(21) Appl. No.: 11/601,047

(22) Filed: Nov. 17, 2006

(65) Prior Publication Data

US 2007/0119543 A1    May 31, 2007

(30) Foreign Application Priority Data

Nov. 29, 2005    (JP)    ............................. 2005-343744
Oct. 30, 2006    (JP)    ............................. 2006-293779

(51) Int. Cl.
*B29C 63/00* (2006.01)
*B29C 65/00* (2006.01)

(52) U.S. Cl. ........................ 156/584; 156/486; 156/475; 156/574; 156/552; 156/580; 156/247; 156/153

(58) Field of Classification Search .................. 156/584, 156/247

See application file for complete search history.

(56) References Cited

U.S. PATENT DOCUMENTS

| 4,557,783 A * | 12/1985 | Grone et al. ................. 156/257 |
| 4,925,515 A | 5/1990 | Yoshimura et al. |
| 5,930,654 A | 7/1999 | Tohyama et al. |
| 5,961,768 A | 10/1999 | Tsujimoto |
| 5,989,384 A * | 11/1999 | Grimshaw et al. .......... 156/312 |
| 6,767,426 B1 | 7/2004 | Yamamoto |

(Continued)

FOREIGN PATENT DOCUMENTS

EP    1 128 415 A2    8/2001

(Continued)

OTHER PUBLICATIONS

European Search Report dated Nov. 19, 2008, for corresponding European application 06124390.3, indicating relevance of listed references in this IDS.

(Continued)

*Primary Examiner*—Khanh Nguyen
*Assistant Examiner*—Vishal I Patel
(74) *Attorney, Agent, or Firm*—Christie, Parker & Hale, LLP (57) ABSTRACT

In a peeling tape attaching apparatus for attaching a peeling tape (4) on a surface protective film (11) attached on the surface of a wafer (20), the wafer is supported on a movable table (31) with the surface protective film up and the peeling tape is supplied on the surface protective film of the wafer. The movable table is moved in such a manner that an end (28) of the wafer is located under a peeling tape attaching unit (46), and pressure is exerted by pressing the peeling tape attaching unit against the surface protective film of the wafer via the peeling tape. After that, the movable table is moved toward the other end (29) of the wafer, and upon movement of the movable table, by a predetermined distance, from the peeling tape attaching unit, the pressure is canceled.

7 Claims, 10 Drawing Sheets

U.S. PATENT DOCUMENTS

| | | | |
|---|---|---|---|
| 7,503,365 B2 * | 3/2009 | Ametani | 156/353 |
| 2002/0096253 A1 | 7/2002 | Shim et al. | |
| 2002/0166625 A1 | 11/2002 | Ball et al. | |
| 2003/0062116 A1 | 4/2003 | Lee | |
| 2003/0064592 A1 | 4/2003 | Yamamoto | |
| 2005/0148156 A1 | 7/2005 | Yamamoto | |
| 2005/0205204 A1 * | 9/2005 | Kurosawa et al. | 156/344 |
| 2005/0282362 A1 * | 12/2005 | Kobayashi et al. | 438/464 |

FOREIGN PATENT DOCUMENTS

| | | |
|---|---|---|
| EP | 1263026 A2 * | 12/2002 |
| EP | 1 328 011 A2 | 7/2003 |
| EP | 1 381 076 A2 | 1/2004 |
| EP | 1 617 462 A2 | 1/2006 |
| EP | 1 729 336 A1 | 12/2006 |
| JP | 6-97268 | 4/1994 |
| JP | 7-24780 | 1/1995 |
| JP | 10-27836 | 1/1995 |
| JP | 7-183365 | 7/1995 |
| JP | 10-284564 | 10/1998 |
| JP | 2002-134438 | 5/2002 |
| JP | 2002-222779 A | 8/2002 |
| JP | 2003-124146 | 4/2003 |
| JP | 2003-197715 | 7/2003 |
| JP | 2004-047976 | 2/2004 |
| JP | 2004-165570 | 6/2004 |
| JP | 2005-175384 | 6/2005 |
| JP | 2005-297458 | 10/2005 |
| JP | 2007-43047 | 2/2007 |
| KR | 2003-0060471 | 7/2003 |
| KR | 10-2005-0059996 | 6/2005 |
| KR | 10-2006-0105532 | 10/2006 |
| WO | WO 2005/101486 | 10/2005 |
| WO | WO 2005/106937 A1 | 11/2005 |

OTHER PUBLICATIONS

Patent Abstracts of Japan, Publication No. 06-097268, dated Apr. 8, 1994, in the name of Saburo Miyamoto.
Patent Abstracts of Japan, Publication No. 2003-197715, dated Jul. 11, 2003, in the name of Haruo Ozaki.
Patent Abstracts of Japan, Publication No. 2005-297458, dated Oct. 27, 2005, in the name of Masaki Tsujimoto.
Singapore Search Report dated Feb. 2, 2007, for SG200607948-7, corresponding to one of Japan priority applications, in the name of Tokyo Seimitsu Co., Ltd.
Patent Abstracts of Japan, Publication No. 2004-165570, dated Jun. 10, 2004, with English translation of publication.
Patent Abstracts of Japan, Publication No. 2007-043047, dated Feb. 15, 2007, with English translation of publication, which corresponds to KR 10-2006-0405532, dated Oct. 11, 2006 listed above.
English abstract for KR 2003-0060471 publication listed above.
Patent Abstracts of Japan, Publication No. 2003124146 A, Published on Apr. 25, 2003, in the name of Tsujimoto.
Korean Office action dated Oct. 24, 2007, for KR 2006-118642, with English translation.
Patent Abstracts of Japan, Publication No. 2005-175384, dated Jun. 30, 2005 with English translation of publication.
Australian Patent Office Examination/Search Report dated Jun. 16, 2006 for corresponding SG 200501479-0, in the name of Tokyo Seimitsu Co., Ltd.
European Search Report dated Apr. 10, 2007, for EP06124389.5, in the name of Tokyo Seimitsu Co., Ltd.
European Search Report dated Dec. 17, 2007 for corresponding European Patent Application No. 06 124 389.5, indicating the relevance of WO 2005/101486.
European Search Report for application No. 05251381.9, dated Jun. 14, 2006, in the name of Tokyo Seimitsu Co., Ltd.
Patent Abstracts of Japan, Publication 07183365, Published Jul. 21, 1995, in the name of Akatani.
Patent Abstracts of Japan, Publication 10027836, Published Jan. 27, 1998, in the name of Yamanaka.
Patent Abstracts of Japan, Publication 10284564, Published Oct. 23, 1998, in the name of Hasegawa.
Patent Abstracts of Japan, Publication No. 07-024780, dated Jan. 27, 1995, in the name of Hiroshi Maurai et al.
Patent Abstracts of Japan, Publication No. 2002134438, dated May 10, 2002, in the name of Shigeki Tanigawa.
Patent Abstracts of Japan, Publication No. 2004-047976, dated Feb. 12, 2004, in the name of Masayuki Yamamoto et al.
Singapore Search Report for SG 200607949-5, corresponding to priority JP 2005-340145.

* cited by examiner

APPARATUS FOR ATTACHING A PEELING TAPE

CROSS-REFERENCE TO RELATED APPLICATION(S)

This application claims priority of Japanese Patent Application Number 2005-343744, filed on Nov. 29, 2005, and Japanese Patent Application Number 2006-293779, filed on Oct. 30, 2006.

BACKGROUND OF THE INVENTION

1. Field of the Invention

This invention relates to a method for attaching a peeling tape on a surface protective film attached on the front surface of a wafer, and a peeling tape attaching apparatus for carrying out the method.

2. Description of the Related Art

In the semiconductor fabrication field, the wafer tends to increase in size every year, on the one hand, and to decrease in thickness to improve the mounting density, on the other hand. To reduce the thickness of the wafer, a back grind process for grinding the back surface of a semiconductor wafer is a common practice. In the back grind process, a surface protective film is attached on the front surface of the wafer to protect the semiconductor elements formed on the front surface of the wafer.

Figure 10:
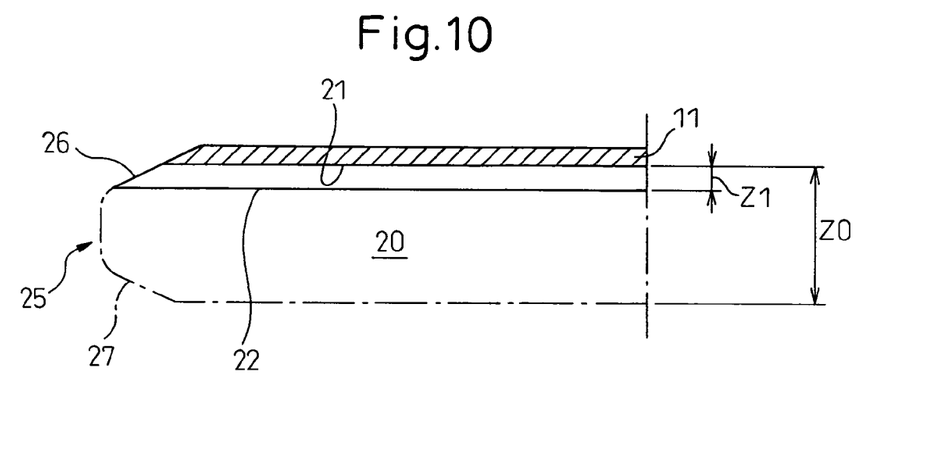
FIG. 10 is an enlarged sectional view of a wafer with the surface protective film attached thereon.

FIG. 10 is an enlarged sectional view showing a circular wafer with a surface protective film attached thereon. As can be understood from FIG. 10, an edge portion 25 of a circular wafer 20 is chamfered. Also, a surface protective film 11 is attached on the front surface 21 of the wafer 20. As shown in FIG. 10, once the back surface of wafer 20 is ground to thickness Z1, from Z0, the chamfered portion 27 on the back surface of the wafer 20 is ground and a new back surface 22 (ground surface) of the wafer 20 reaches the chamfered portion 26 on the front surface 21.

Figure 11:
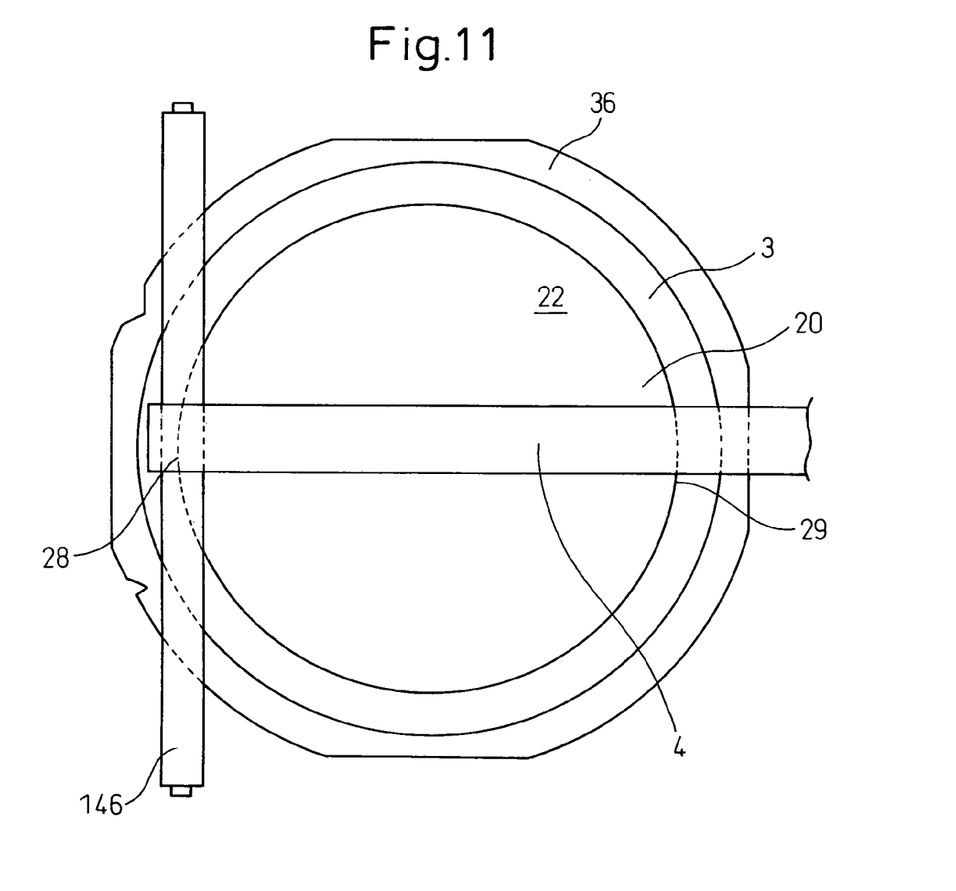
FIG. 11 is a top plan view of a wafer integrated with a mount frame.
Figure 12:
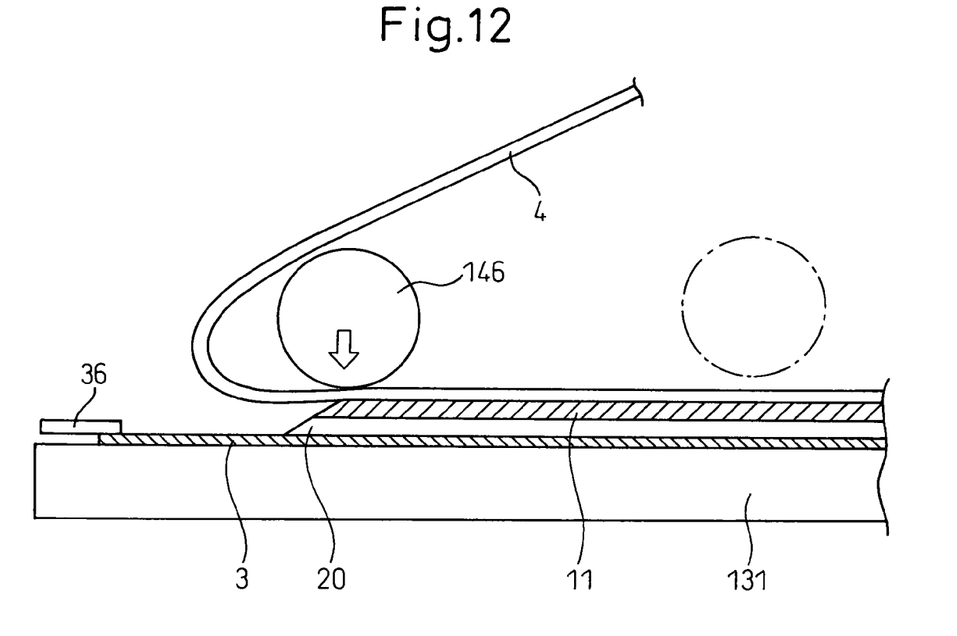
FIG. 12 is a sectional view showing the state in which the peeling tape is attached on the surface protective tape of the wafer according to the prior art.

Next, a dicing tape 3 is attached on the back surface 22 of the wafer 20 as shown in FIG. 11. As a result, the wafer 20 is integrated with a mount frame 36. After that, as shown in FIG. 12, the wafer 20 is supported on a table 131 with the surface protective film 11 up. A peeling tape 4 is supplied onto the surface protective film 11, after which a peeling roll 146 is pressed against the surface protective film 11 to thereby attach the peeling tape 4 on the surface protective film 11. Next, the table 131 supporting the wafer 20 is moved horizontally so that the surface protective film 11 is peeled off from the wafer 20 together with the peeling tape 4.

As shown in FIG. 12, in the case where the peeling tape 4 is attached using the peeling roll 146, the peeling tape 4 may be loosened in accordance with the relative speed between the peeling roll 146 and the peeling tape 4. Also, as described above, the thickness of the wafer 20 is reduced considerably. When attaching the peeling tape 4 by the peeling roll 146, therefore, the peeling tape 4 and the dicing tape 3 are liable to bond to each other. Also, in view of the fact that the adhesive surfaces of the tapes 3 and 4 face each other, the tapes 3 and 4, once bonded to each other, are very difficult to separate without damaging the wafer 20.

Further, as the thickness of the wafer 20 is reduced greatly, the rigidity of the wafer is also considerably reduced. In the case where the peeling tape 4 is attached on the surface protective film 11 by the peeling roll 146, therefore, cuts or cracks are formed in the wafer 20 and the yield of the product is reduced. Also, even in the case where no cuts or no cracks develop, internal strains, in the wafer 20, occur and may appear as cuts or cracks in subsequent processes.

This invention has been achieved in view of this situation, and the object thereof is to provide a peeling tape attaching method and a peeling tape attaching apparatus for carrying out the method, in which the attaching operation for attaching the peeling tape on the wafer is accurately controlled and thus bonding between the peeling tape and the dicing tape can be prevented, and cuts or cracks of the wafer can be prevented.

SUMMARY OF THE INVENTION

In order to achieve the object described above, according to a first aspect of the invention, there is provided a peeling tape attaching apparatus for attaching a peeling tape on a surface protective film attached on the surface of a wafer, comprising a horizontally movable table for supporting the wafer with the surface protective film up, a supply means for supplying the peeling tape onto the surface protective film of the wafer supported on the movable table, a peeling tape attaching means for attaching the peeling tape supplied from the supply means on the surface protective film of the wafer, and a pressing means for applying a pressing force by pressing the peeling tape attaching means against the surface protective film of the wafer via the peeling tape, wherein the pressing means applies pressing force by pressing the peeling tape attaching means against the surface protective film via the peeling tape when an end of the wafer is located under the peeling tape attaching means by the movable table, and the pressing force is canceled when the movable table moves toward the other end of the wafer by a predetermined distance from the peeling tape attaching means.

Specifically, in the first aspect, a pressing force is applied by pressing the peeling tape attaching means against the surface protective film only in the neighborhood of an end of the wafer and, therefore, cuts or cracks are prevented from occurring over the whole wafer. Also, this accurate control operation can prevent the peeling tape and the dicing tape from being bonded to each other. After canceling the pressing force, the peeling tape attaching means is desirably kept in contact to the peeling tape by its own weight.

According to a second aspect of the invention, there is provided a peeling tape attaching apparatus as described in the first aspect, wherein a gap is formed between the peeling tape attaching means and the surface protective film when the pressing force is canceled.

Specifically, in the second aspect, the force exerted by the peeling tape attaching means on the surface protective film via the peeling tape can be reduced to zero and, therefore, cuts or cracks or internal strains can be further prevented.

According to a third aspect of the invention, there is provided a peeling tape attaching apparatus as described in the first or second aspect, wherein the back surface of the wafer with the surface protective film attached on the obverse surface thereof is ground in advance.

Specifically, in the third aspect, even in the case where the back surface of the wafer is ground to such an extent that the ground surface reaches the chamfered portion of the front surface, the wafer can be prevented from forming fractions or crackings or internal strains. The thickness of the wafer with the back surface thereof ground can be, for example, not more than 100 micrometers.

According to a fourth aspect of the invention, there is provided a peeling tape attaching apparatus, as described in any one of the first to third aspects, wherein the peeling tape attaching means is mounted at the forward end of a pivot means pivotable around the pivot axis of the pressing means.

Specifically, in the fourth aspect, even in the case where a comparatively thick semiconductor element is formed on the surface of the wafer, the movable table can be smoothly moved.

According to a fifth aspect of the invention, there is provided a peeling tape attaching apparatus as described in the fourth aspect, wherein the width of the pivot means perpendicular to the direction of movement of the movable table is smaller than or substantially equal to the width of the peeling tape.

Specifically, in the fifth aspect, the foreign matter which can be generated from the portion deviated from the width of the peeling tape can be prevented from attaching on the wafer as far as possible.

According to a sixth aspect of the invention, there is provided a peeling tape attaching apparatus as described in any one of the first to fifth aspects, further comprising a height adjusting means for adjusting the height of the peeling tape attaching means and at least one of an input means for inputting the thickness of the wafer and the thickness of the surface protective film and a height detection means for detecting the height of the peeling tape supplied from the supply means, wherein the height adjusting means adjusts the height of the peeling tape attaching means based on the thickness of the wafer and the thickness of the surface protective film input from the input means and/or the height of the peeling tape detected by the height detection means.

Specifically, in the sixth aspect, the height of the pressing means can be accurately adjusted in accordance with the degree to which the back surface of the wafer is ground and the thickness of the used surface protective film and/or the height of the peeling tape.

According to a seventh aspect of the invention, there is provided a peeling tape attaching apparatus as described in any one of the first to sixth aspects, wherein the dicing tape is attached on the back surface of the wafer and the lower surface of a mount frame, so that the wafer and the mount frame are integrated with each other, and a groove corresponding to a part of the dicing tape between the mount frame and the wafer is formed on the top surface of the movable table.

Specifically, in the seventh aspect, a part of the corresponding dicing tape drops in the groove when the wafer is supported and, therefore, the peeling tape and the dicing tape are further prevented from being bonded to each other.

According to an eighth aspect of the invention, there is provided a peeling tape attaching apparatus as described in any one of the first to seventh aspects, wherein the pressing means is an air cylinder and the air cylinder has a stopper for stopping the rod of the air cylinder before the stroke end thereof.

Specifically, in the eighth aspect, the peeling tape attaching means can be held before the stroke end and therefore the peeling tape attaching means can be smoothly moved.

According to a ninth aspect of the invention, there is provided a peeling tape attaching method for attaching a peeling tape on a surface protective film attached on the surface of a wafer, comprising the steps of supporting the wafer with the surface protective film up on the movable table, supplying the peeling tape onto the surface protective film of the wafer, moving the movable table so that an end of the wafer is located under the peeling tape attaching means, applying pressing force by pressing the peeling tape attaching means against the surface protective film of the wafer via the peeling tape, moving the movable table toward the other end of the wafer, and canceling the pressing force upon movement of the movable table by a predetermined distance from the peeling tape attaching means.

Specifically, in the ninth aspect, pressing force is applied by pressing the peeling tape attaching means against the surface protective film only in the neighborhood of an end of the wafer and, therefore, the whole wafer is prevented from forming cuts or cracks. Also, this accurate control operation can prevent the peeling tape and the dicing tape from being bonded to each other. After canceling the pressing force, the peeling tape attaching means is desirably kept in contact with the peeling tape by its own weight.

According to a tenth aspect of the invention, there is provided a peeling tape attaching method as described in the ninth aspect, wherein a gap is formed between the peeling tape attaching means and the surface protective film when the pressing force is canceled.

Specifically, in the tenth aspect, the force exerted by the peeling tape attaching means on the surface protective film through the peeling tape can be reduced to zero and, therefore, the wafer is further prevented from forming fractions or cracks or internal strains.

According to an 11th aspect of the invention, there is provided a peeling tape attaching method as described in the ninth or tenth aspect, further comprising the steps of detecting the input of the thickness of the wafer and the thickness of the surface protective film and/or the height of the peeling tape, and adjusting the height of the peeling tape attaching means based on the input wafer thickness and the input thickness of the surface protective film and/or the detected height of the peeling tape.

Specifically, in the 11th aspect, the height of the pressing means can be accurately adjusted in accordance with the degree to which the back surface of the wafer is ground and with the thickness of the used surface protective film and/or the height of the peeling tape.

These and other objects, features and advantages of the present invention will be more apparent in light of the detailed description of exemplary embodiments thereof as illustrated by the drawings.

BRIEF DESCRIPTION OF THE DRAWINGS

FIG. 9b is a partially enlarged top plan view of the peeling tape attaching unit shown in FIG. 9a.

DETAILED DESCRIPTION OF THE INVENTION

Embodiments of the invention are explained below with reference to the accompanying drawings. In the drawings, the same component members are designated by the same reference numerals, respectively. To facilitate the understanding, the scale of these drawings is changed appropriately.

Figure 1:
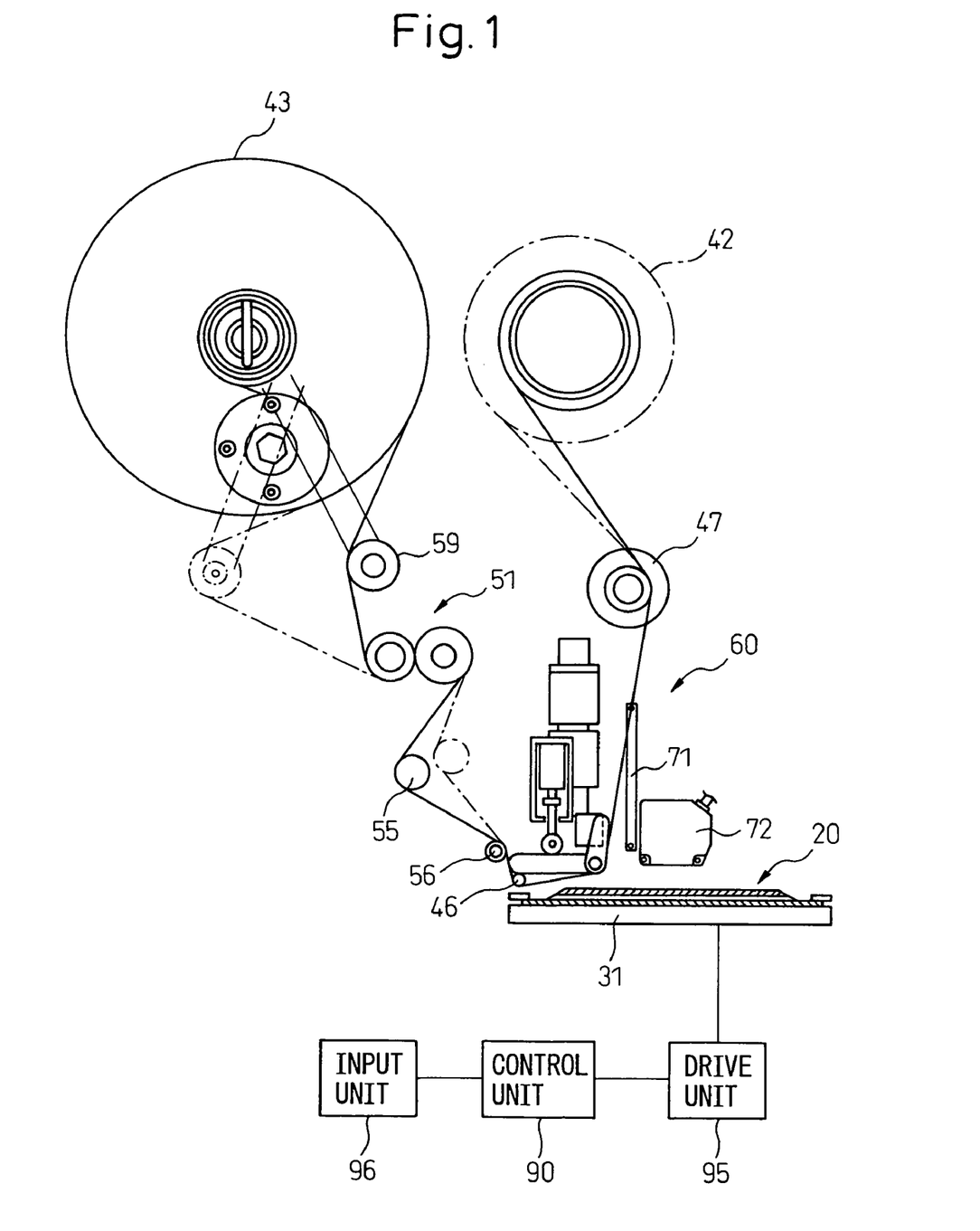
FIG. 1 is a schematic sectional view showing a surface protective film peeling device having a peeling tape attaching unit according to this invention.

FIG. 1 is a schematic sectional view showing a surface protective film peeling device having a peeling tape attaching unit according to this invention. The wafer 20 supplied to the surface protective film peeling device 10, as explained with reference to FIG. 10, has the back surface thereof ground by the back grind process up to a chamfered portion 26 on the front surface, and the thickness of the wafer 20 is assumed to be not more than 100 micrometers. Also, as is well known, the surface protective film 11 for protecting the semiconductor devices is already attached on the front surface of the wafer 20. Further, a dicing tape 3 is attached on the ground surface 22 of the wafer 20, and the wafer 20 is integrated with a mount frame 36 via the dicing tape 3.

The surface protective film peeling device 10 shown in FIG. 1 includes a supply unit 42 for supplying the peeling tape 4 to be attached on the surface protective film 11 attached in advance on the front surface of a circular silicon wafer 20 and a take-up unit 43 for taking up the peeling tape from the supply unit 42. Also, a control unit 90 such as a digital computer is arranged in a lower portion of the surface protective film peeling device 10. In the description that follows, the peeling tape 4 is called a pressure sensitive tape which provides an adhesive function when pressure is applied. Nevertheless, the peeling tape 4 may alternatively be a heat sensitive tape as described later.

As shown in FIG. 1, a guide roll 47 for guiding the peeling tape 4 and for giving a predetermined tension to the peeling tape 4 is arranged downstream of the supply unit 42. The peeling tape 4 is guided to the take-up unit 43 through the peeling roll 46 of the peeling tape attaching unit 60. Further, a guide roll 56, a dancer roll 5, a pair of guide rolls 51 and another dancer roll 59 are arranged between the peeling roll 46 and the take-up unit 43. The dancer rolls 55, 59 move in accordance with the amount of the peeling tape 4 supplied.

Figure 2:
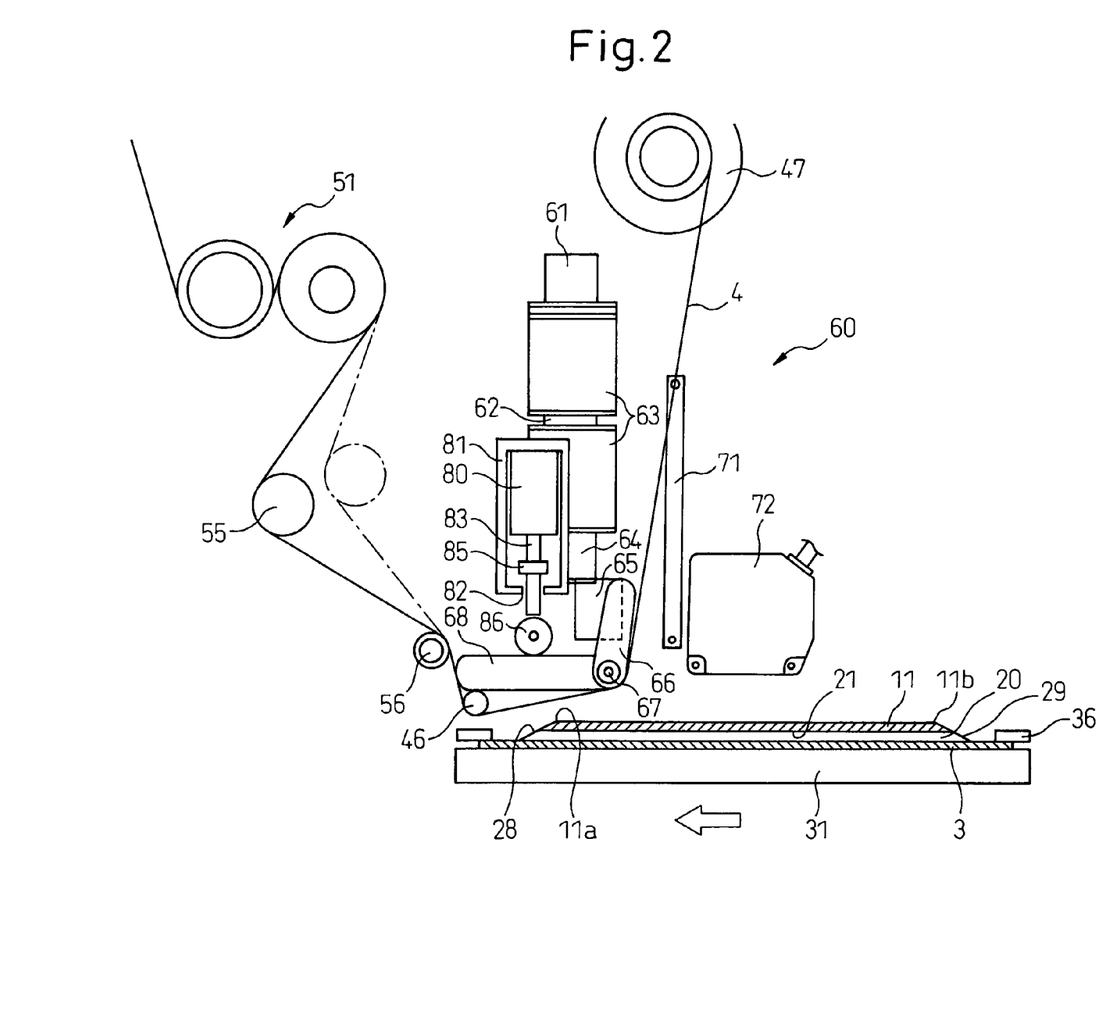
FIG. 2 is an enlarged view of a peeling tape attaching unit included in the surface protective film peeling device.

FIG. 2 is an enlarged view showing the peeling tape attaching unit 60 included in the surface protective film peeling device 10. A movable table 31 is arranged under the peeling tape attaching unit 60. This movable table 31 is connected to a drive unit 95 (see FIG. 1), and adapted to move horizontally. The wafer 20 with the front surface 21 on which the surface protective film 11 is attached, up is supported on the movable table 31. When the wafer 20 is supported, therefore, the dicing tape 3 attached on the back surface 22 of the wafer 20 is in direct contact with the movable table 31.

The mount frame 36 integrated with the wafer 20 via the dicing tape 3, when the wafer 20 is diced into cubes, functions to hold each part of the wafer 20 thus cut. The wafer 20 is assumed to be supported by well-known means such as vacuum adsorption on the movable table 31.

Figure 3A:
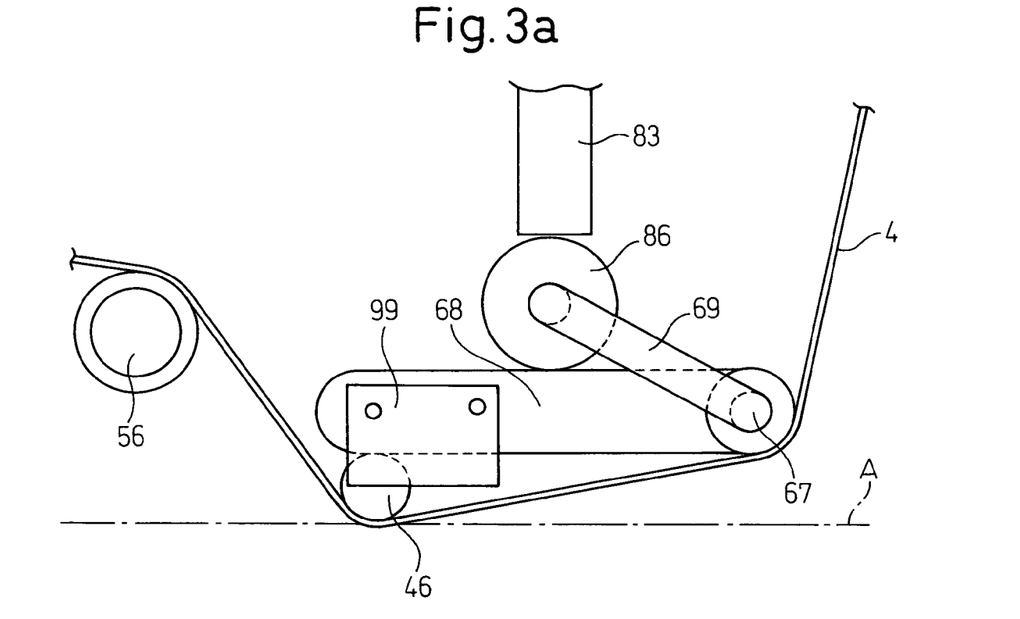
FIG. 3a is an enlarged view showing the operation of a pivot arm at the time of driving an air cylinder.
Figure 3B:
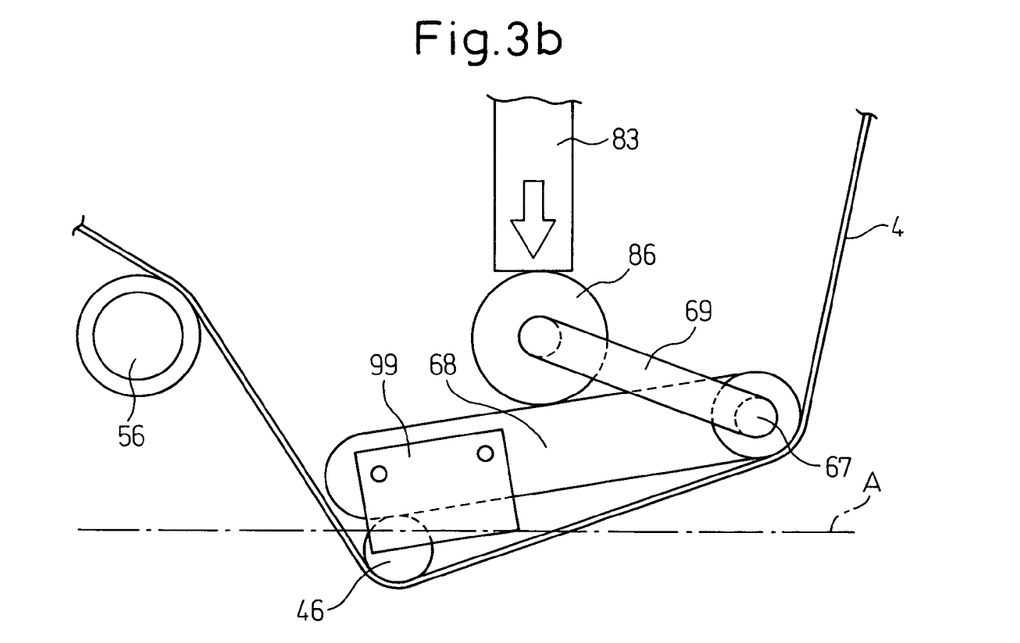
FIG. 3b is another enlarged view showing the operation of the pivot arm at the time of driving the air cylinder.

The peeling tape attaching unit 60 includes a ball screw 61. The ball screw 61 functions to move a cover guide portion 63 up and down along a vertical shaft 62. A fixed arm 66 is mounted via fixing blocks 64, 65 at the forward end of the cover guide portion 63. A pivot arm 68 pivotable around a pivot shaft portion 67 is arranged at the forward end of the fixed arm 66. This pivot arm 68 is normally urged horizontally by a spring or the like not shown. Further, the peeling roll 46 is rotatably arranged by a fitting 99 (see FIG. 3) at the forward end of the pivot arm 68.

As shown in FIG. 2, a freely rotatable roller 86 is arranged on the upper surface of the pivot arm 68. As understood from FIG. 3 described later, the rotary shaft of the roller 86 and the pivot shaft portion 67 are connected by a plate 69.

Also, the width of the pivot arm 68 perpendicular to the moving direction of the movable table 31 is smaller than or substantially equal to the width of the peeling tape 4. As a result, at the time of the attaching operation and the peeling operation described later, foreign matter dropped from a part of the rotary arm 68 deviated from the width of the peeling tape is prevented as far as possible from attaching on the wafer. The length of the peeling roll 46 perpendicular to the moving direction of the movable table 31 may be smaller than or substantially equal to the width of the peeling tape 4. In this case, a similar effect can still be obtained.

As shown in FIG. 2, a casing 81 of the air cylinder 80 is mounted on the cover guide portion 63. The rod 83 adapted to move up and down by the operation of the air cylinder 80 extends through a hole 82 formed in the lower surface of the air cylinder casing 81. As shown in FIG. 2, a flange 85 is fixed midway of the rod 83. The diameter of the flange 85 is larger than the hole 82 of the air cylinder casing 81, and the flange 85 functions as a stopper restricting the operation of the rod 83. Though not shown, the rod 83 is connected to the piston in the air cylinder 80.

Further, the air cylinder 80 is driven by a motor not shown. The roller 86 engages with the forward end of the rod 83. Once the rod 80 extends downward, therefore, the pivot arm 68 is pressed to pivot through the roller 86. The motor of the air cylinder 80 and the motor (not shown) for driving the ball screw 61 are connected to the control unit 90.

Also, a height sensor 71 for detecting the height of the peeling tape attaching unit 60, or for example, the height of the peeling roll 46 is arranged along a shaft 62. This height sensor 71 can also detect the height of the peeling tape 4 engaged with the peeling roll 46.

A position sensor 72 arranged adjacently to the height sensor 71 detects the horizontal position of the wafer 20 supported on the movable table 31 or, especially, the horizontal position of the end portion 28 of the wafer 20. The position sensor 72 can also detect the height of the surface protective film 11 attached on the wafer 20. These sensors 71, 72 are also connected to the control unit 90.

Further, as can be understood by referring to FIG. 1 again, the input unit 96 such as a keyboard or a mouse is connected to the control unit 90. The operator can appropriately input the thickness of the wafer 20, after it has been back ground, and/or the thickness of the surface protective film 11 and the thickness of the dicing film 3 by way of the input unit 96.

Next, the attaching operation and the peeling operation of the peeling tape attaching unit 60 according to the invention will be explained. First, the peeling tape 4 is supplied from the supply unit 42 through the guide roll 47. Then, the wafer 20 is supported on the movable table 31, as described above, after which the movable table 31 is moved horizontally, whereby one end 28 of the wafer 20 is located under the peeling roll 46.

The end 28 of the wafer 20, which is originally a chamfered portion, is formed diagonally. Strictly speaking, therefore, the movable table 31 is set in position in such a manner that the edge 11a of the flat portion of the surface protective film 11 is located under the peeling roll 46. In the description that follows, one end 28 (or the other end 29) of the wafer 20 may be defined as the edge 11a (or the other edge 11b) of the flat portion of the surface protective film 11.

Next, the ball screw 61 is driven so that the peeling tape attaching unit 60 is moved down until the peeling roll 46 reaches the edge 11a of the surface protective film 11. The distance by which the peeling tape attaching unit 60 is moved downward is calculated based on the height of the peeling tape 4 and the peeling roll 46 detected by the sensor 71. As an alternative, the thicknesses of the wafer 20, the dicing tape 3 and the surface protective film 11 beforehand from the input unit 96, then the distance by which the peeling tape attaching unit 60 is moved down can be determined by taking the thicknesses of these component parts into consideration. As a result, even in the case where the degree to which the wafer 20 is back ground and/or the thickness of the surface protective film 11 varies from one wafer 20 or lot to another, the peeling roll 46 of the peeling tape attaching unit 60 can be exactly set in position.

This downward movement exerts force only by the weight of the peeling roll 46 on the edge 11a of the surface protective film 11. The force exerted only by the weight of the peeling roll 46 is designated as F0.

Next, the air cylinder 80 is driven. FIGS. 3a, 3b are enlarged views showing the operation of the pivot arm at the time of driving the air cylinder 80. In FIGS. 3a, 3b, the line A indicates the height of the surface protective film 11 at the time of attaching the peeling tape 4. If the air cylinder 80 is driven and the rod 83 is extended downward, the pivot arm 68 is pressed downward via the roller 86 engaged with the forward end of the rod 83. Thus, the pivot arm 68 rotates around the pivot shaft portion 67, with the result that pressing force is exerted by the peeling roll 46 on the surface protective film 11 of the wafer 20 via the peeling tape 4.

Figure 4:
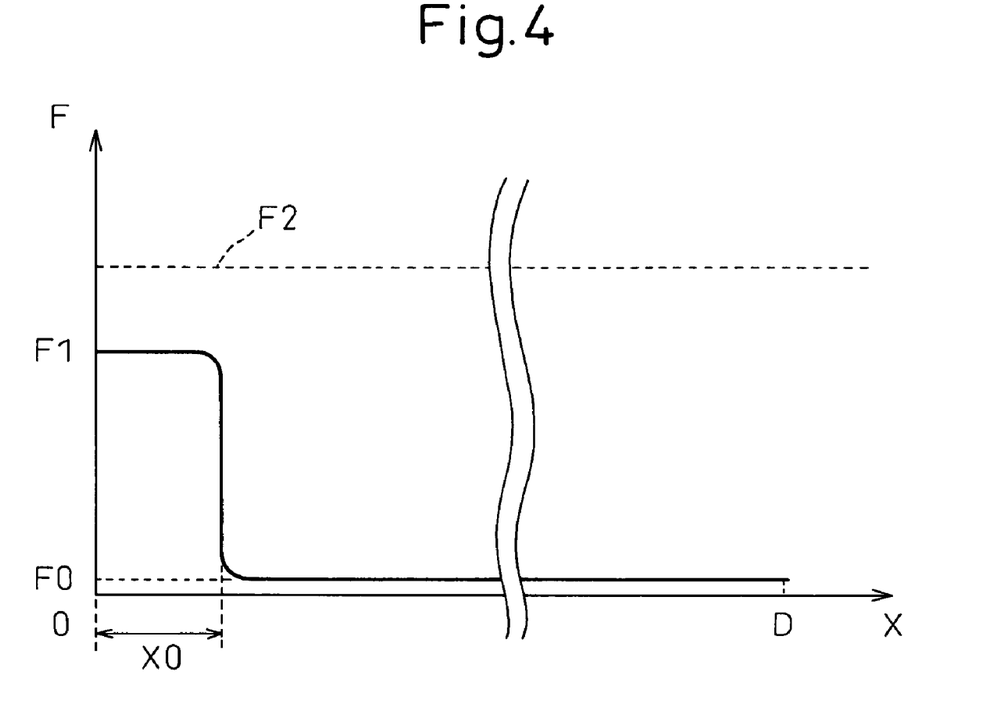
FIG. 4 is a diagram showing the relation between the distance covered by a movable table and the pressing force.

FIG. 4 is a diagram showing the relation between the distance covered by the movable table 31 and the pressing force. In FIG. 4, the abscissa represents the distance x covered by the movable table 31 and the ordinate represents the pressing force F. The force F0 only by the weight of the peeling roll 46 increases to the pressing force F1 by driving the air cylinder 80. This pressing force F1 is sufficiently large to attach the peeling tape 4 on the surface protective film 11, on the one hand, and smaller than the pressing force F2 generating cuts or cracks or internal strains in the wafer 20, on the other hand.

FIG. 3b shows that the lower portion of the peeling roll 46 is projected downward from line A. The surface protective film 11 of the wafer 20 is slightly depressed under pressing force, but not to such an extent as to move down the movable table 31 supporting the wafer 20.

Next, the movable table 31 is moved in diametrical direction of the wafer 20 from one end 28 toward the other end 29 of the wafer 20. Upon the movement of the movable table 31 by a predetermined distance x0 from the peeling roll 46, the air cylinder 80 is driven and the rod 83 is moved up. As a result, the pivot arm 68 returns to the initial horizontal position (see FIG. 3a), so that the pressing force of the peeling roll 46 is reduced to the force F0 equal to the weight of the peeling roll 46 only. The predetermined distance x0 is sufficiently small as compared with the diameter D of the wafer 20, and therefore the pressing force F1 is applied only at the edge 11a and in the area in the neighborhood of the edge 11a of the surface protective film 11. After that, the movable table 31 is moved to the other end 29 of the wafer 20, so that the peeling tape 4 is attached on the surface protective film 11 along the direction in which the movable table 31 is moved.

As described above, according to this invention, pressing force is exerted only at the end 28 of the wafer 20 at the time of attaching the peeling tape 4, and therefore, the wafer as a whole develops no fractions no crackings or internal strains. Also, as a pressing force is exerted at the edge 11a of the surface protective film 11 as described above, the peeling tape 4 and the dicing tape 3 are prevented from being bonded to each other.

According to an alternative embodiment, a pressing force may be exerted only at the edge 11a of the surface protective film 11 without moving the movable table 31 by the predetermined distance x0. According to still another embodiment, after exerting pressing force at the edge 11a of the surface protective film 11, the peeling tape attaching unit 60 is moved up by driving the ball screw 61, thereby forming a gap between the peeling roll 46 and the surface protective film 11. In this case, the force exerted by the peeling roll 46 on the surface protective film 11 via the peeling tape 4 is reduced to zero. In the attaching operation after attaching the peeling tape 4 at the edge 11a, therefore, the possibility for forming cuts, cracks or internal strains in the wafer 20 are entirely eliminated.

In view of the fact that the surface protective film 11 is already attached on the front surface 21 of the wafer 20, on which semiconductor devices (not shown) are formed, uneven spots or steps may be formed on the front surface of the surface protective film 11 in accordance with the thicknesses of the semiconductor devices. Also, even in the case where the thicknesses of the semiconductor devices are not large, uneven spots or steps may be formed on the front surface of the surface protective film 11 by foreign matter or the like.

According to this invention, in contrast, the peeling roll 46 is mounted at the forward end of the pivot arm 68 and, therefore, the effect of the uneven spots or steps can be avoided as the pivot arm 68 is pivoted in accordance with the uneven spots or steps at the time of movement of the movable table 31. Specifically, the pivot arm 68 and the related air cylinder 80 function as a cushion to absorb the effect of the uneven spots or steps. According to this invention, therefore, even in the case where uneven spots or steps are formed on the surface of the surface protective film 11, the movable table 31 can be smoothly moved, so that the peeling tape 4 can be properly attached.

As described above, the flange 85 is arranged midway on the rod 83 of the air cylinder 80. The flange 85 engages the outer peripheral portion of the hole 82 of the air cylinder casing 81 and prevents the rod 83 from extending to its maximum stroke. As a result, the rod 83 extends only to a position where the flange 85 engages the outer peripheral portion of the hole 82.

According to the prior art, the attaching operation is performed with the rod of the air cylinder extended to about the maximum stroke thereof. In such a case, the sliding resistance and the variation thereof at the time of operation of the air cylinder are so large that the rod 83 cannot be easily moved smoothly from the position of maximum stroke. According to this invention, in contrast, the extension of the rod 83 is limited by the flange 85, and therefore the rod 83 can be smoothly moved at the time of attaching the peeling tape 4, with the result that the peeling tape 4 can be attached in a stable condition. It is apparent that the flange 85 is arranged at a place where the sliding resistance and the variation are comparatively small at the time of operation of the air cylinder.

Figure 5:
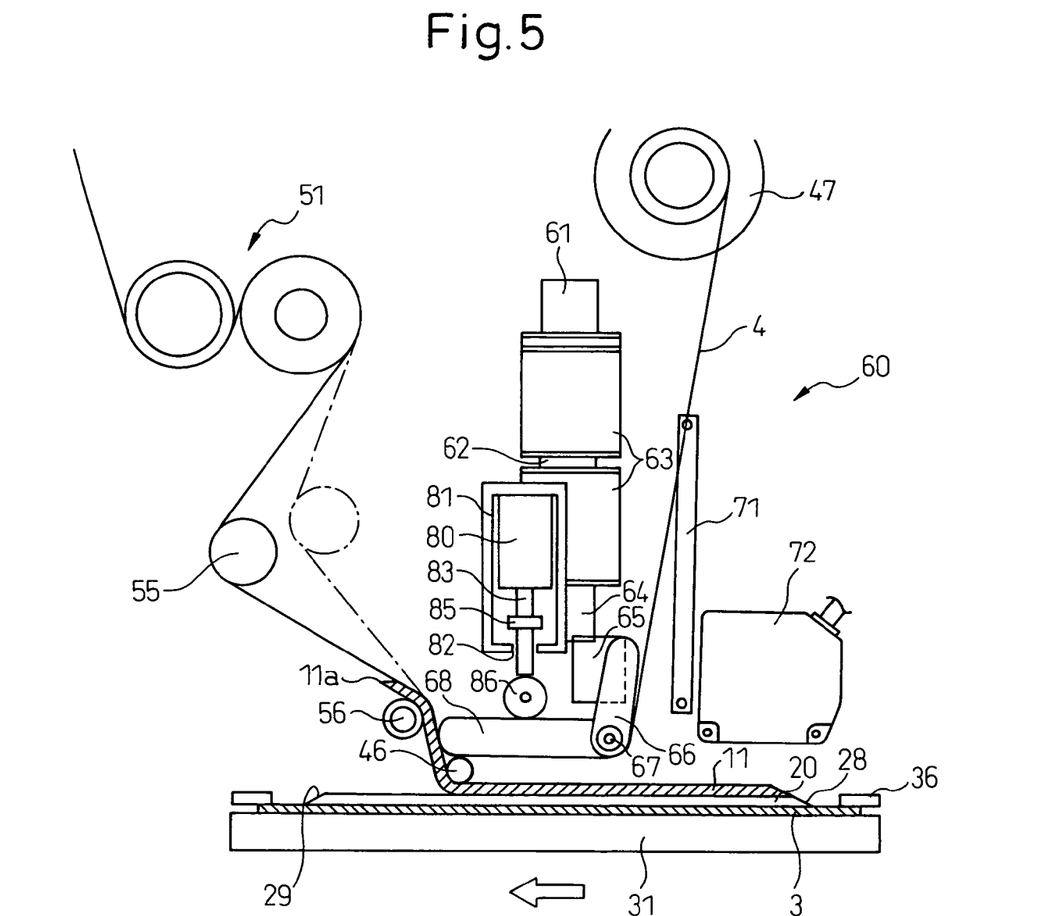
FIG. 5 is another enlarged view showing the peeling tape attaching unit included in the surface protective film peeling device.

Upon completing operation for attaching the peeling tape 4 on the surface protective film 11, the surface protective film 11 and the peeling tape 4 are peeled off from the wafer 20. As shown in FIG. 5, the movable table 31 is moved leftward toward an end 28 from the other end 29 of the wafer 20 under the peeling roll 46, so that the surface protective film 11 is peeled from the wafer 20 together with the peeling tape 4. At the time of peeling, the take-up starting time of the peeling tape 4 by the take-up unit 43 is delayed to secure a distance between the peeling roll 46 and the peeling tape 4. In this way, the peeling operation can be performed continuously while maintaining the peel angle at about 90° to 180°.

Figure 6:
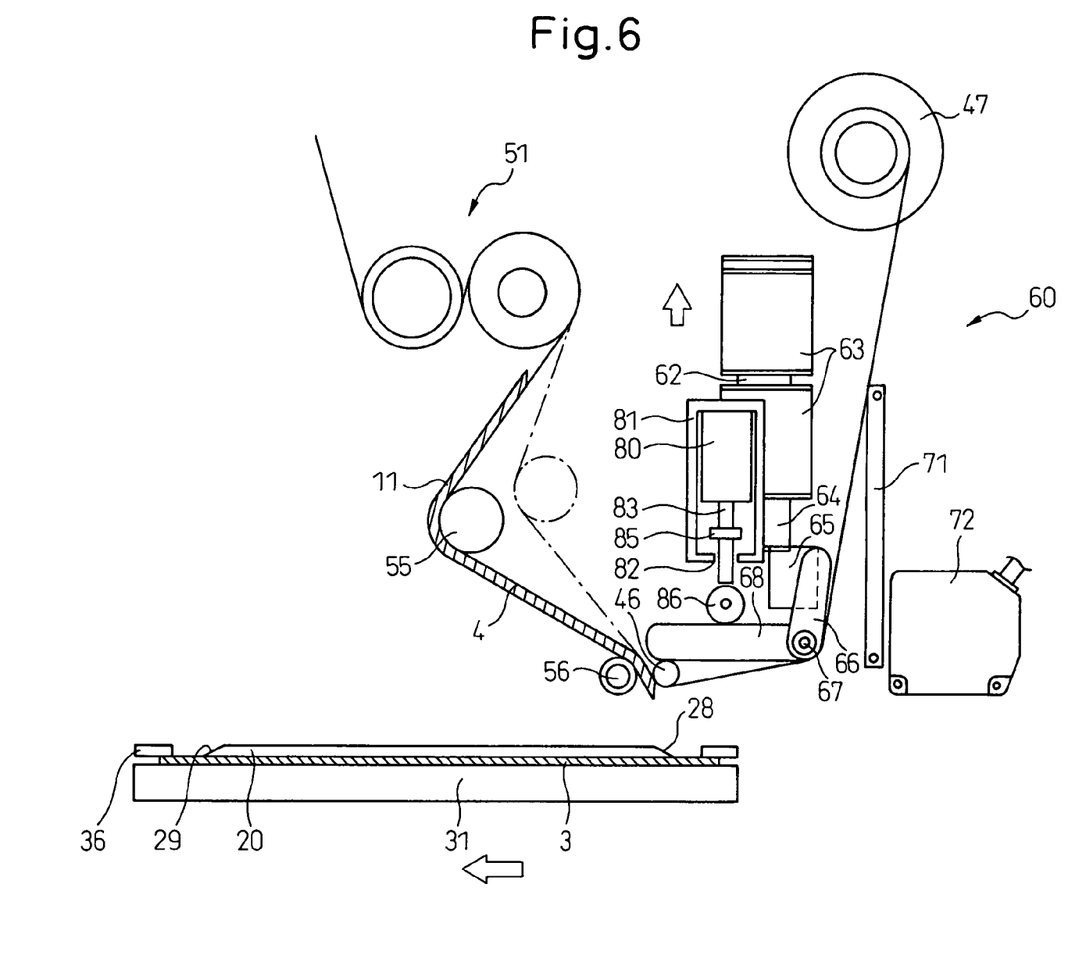
FIG. 6 is still another enlarged view showing the peeling tape attaching unit included in the surface protective film peeling device.

Next, as shown in FIG. 6, at the end or immediately before the end of the peeling-off operation of the surface protective film 11, the peeling tape attaching unit 60 may be moved up using the ball screw 61. As a result, the peeling tape 4 can be prevented from being bonded to the dicing tape 3.

Figure 7:
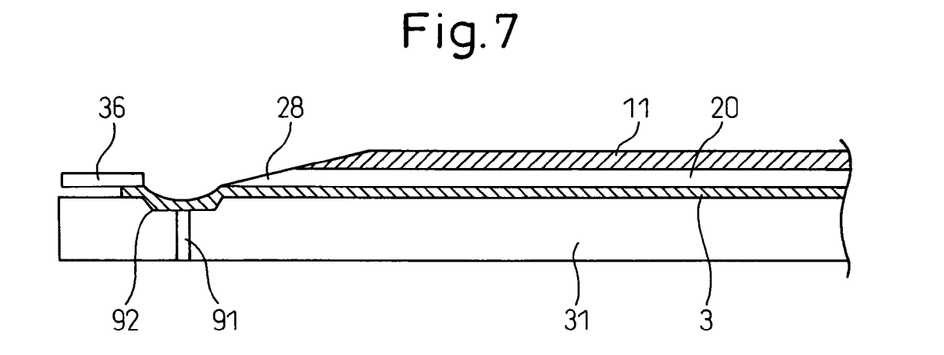
FIG. 7 is a partial sectional view of the movable table used with the peeling tape attaching apparatus according to another embodiment.

FIG. 7 is a partial sectional view showing the movable table 31 used with the peeling tape attaching apparatus according to another embodiment. An annular groove 92 is formed at the top surface of the movable table 31 shown in FIG. 7. As shown in FIG. 7, the annular groove 92 is formed in such a manner as to be located in the area of the dicing tape 3 between the end portion 28 of the wafer 20 and the mount frame 36 when supporting the wafer 20. Further, in the case where the movable table 31 is a vacuum adsorption table, an adsorption path 91 extending from the bottom of the annular groove 92 is also formed. This adsorption path 91 is connected to the adsorption path for the wafer 20 not shown and a vacuum source not shown.

In the case where the wafer 20 is supported on such a movable table 31, a part of the dicing tape 3 corresponding to the annular groove 92 is pulled down into the annular groove 92 and, therefore, the upper surface of this part of the dicing tape 3 is depressed. As a result, the peeling tape 4 (not shown in FIG. 7) and the dicing tape 3 are away from each other, thereby further preventing them from being bonded to each other.

Figure 9A:
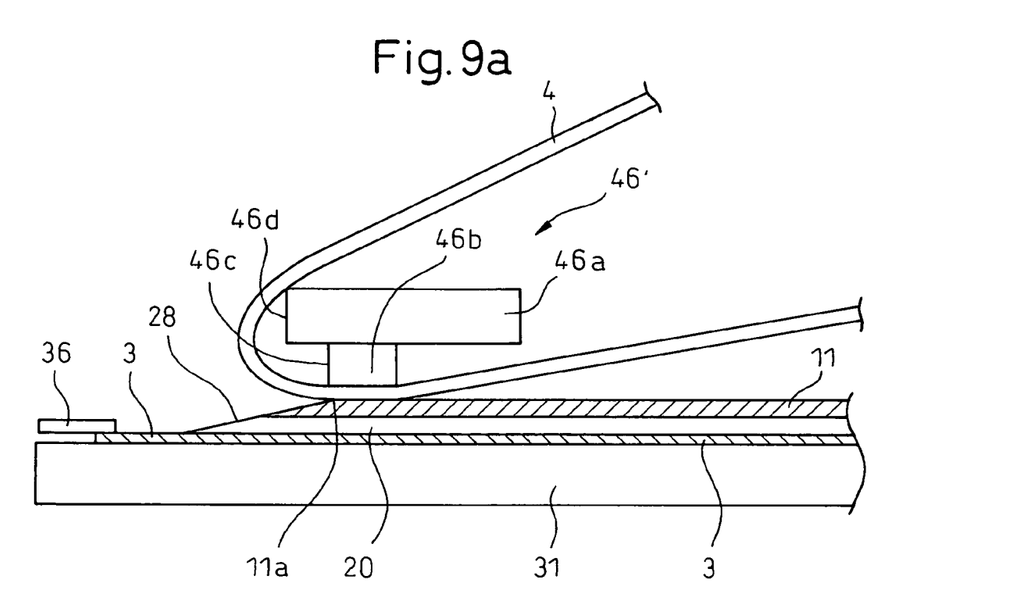
FIG. 9a is a partially enlarged side view of the peeling tape attaching unit included in the surface protective film peeling device.
Figure 9B:
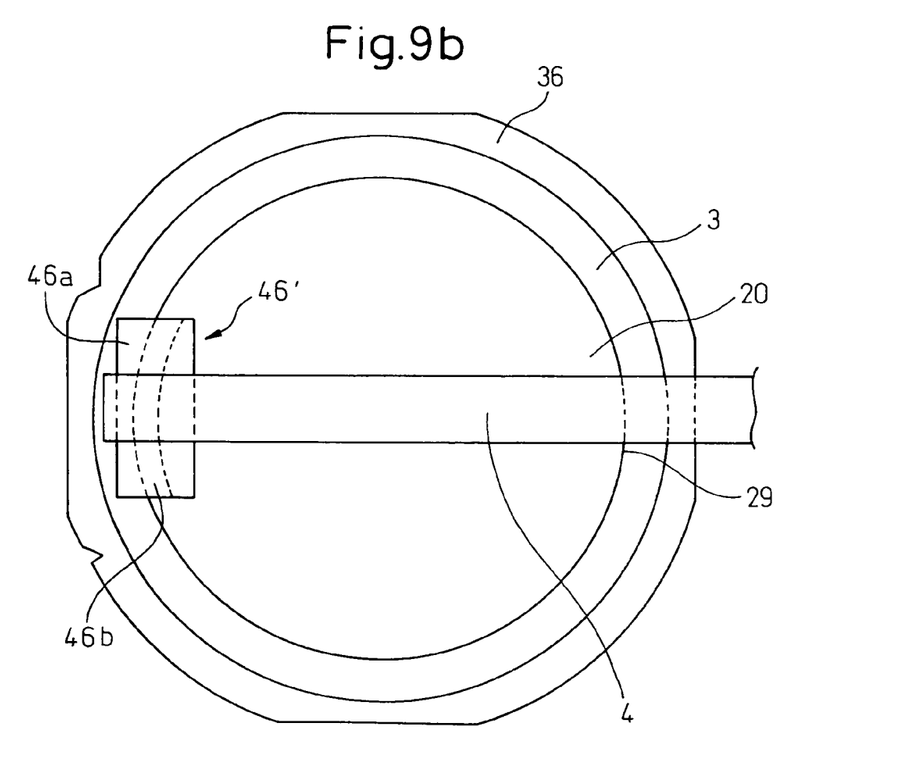

Although the peeling roll 46 having a circular section is used in the embodiment described above with reference to the drawings, a peeling member (not shown) having other than a circular section such as a rectangular or triangular section may be employed in place of the peeling roll 46. The peeling member employed in a preferred embodiment has a part thereof formed in the shape corresponding to the contour of the wafer 20. FIGS. 9a and 9b are a partially enlarged side view and a partially enlarged top plan view, respectively, of the peeling tape attaching unit including such a peeling member 46'.

The peeling member 46' shown in these drawings includes a block 46a and a curved portion 46b attached to the lower surface of the block 46a. As shown, the curved portion 46b is in the shape corresponding to a part of the contour of the wafer 20, and the curved portion 46b has a rectangular section. Though not shown in FIGS. 9a, 9b, the peeling member 46' is mounted on the pivot arm 68 as is the peeling roll 46.

The peeling member 46' is arranged in such a manner that the lower surface of the curved portion 46b substantially corresponds to the contour of the wafer 20. In the process, the outer edge 46c of the curved portion 46b is located in the neighborhood of the edge 11a. Then, the peeling tape 4 is attached on the surface protective film 11 of the wafer 20 by a similar method to the aforementioned method. In this embodiment, the curved portion 46b corresponds to a part of the contour of the wafer 20, and therefore the peeling tape 4 is pressed only the required minimum portion. As a result, the peeling tape 4 is further prevented from being bonded to the dicing tape 3 when being attached. Incidentally, the outer edge portion 46d of the block 46a and the outer edge portion 46c of the curved portion 46b may be located in the same plane.

Figure 8:
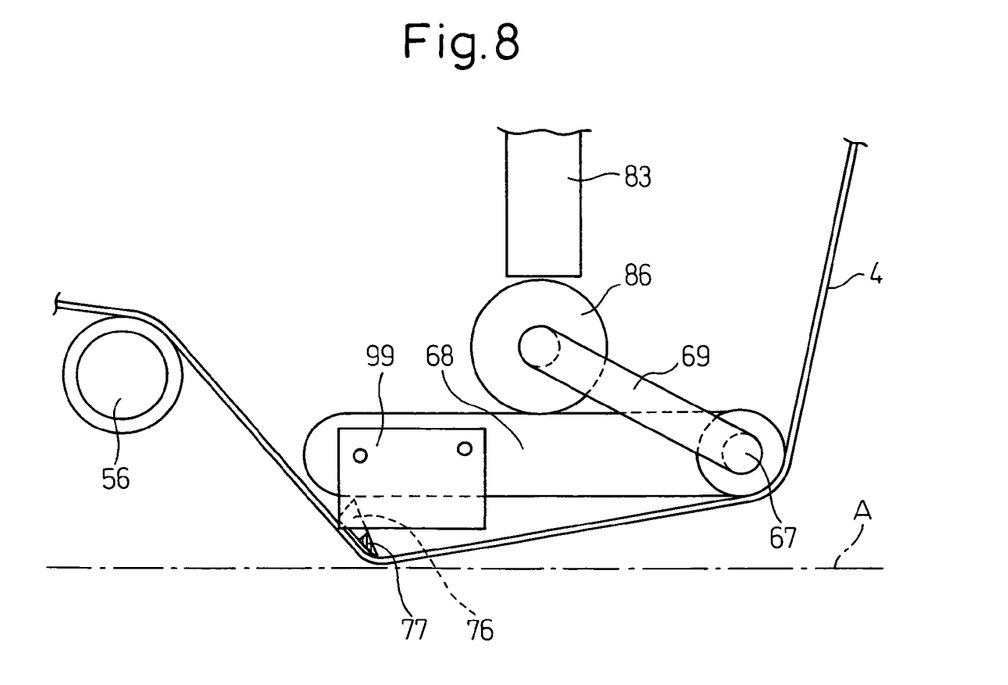
FIG. 8 is a partial sectional view of the peeling tape attaching apparatus according to still another embodiment.

The aforementioned embodiments are described on the assumption that the peeling tape 4 is a pressure sensitive tape. Nevertheless, what is called a heat sensitive tape which exhibits the adhesive force by being heated may alternatively be employed as the peeling tape 4. In this case, the peeling roll 46 or the peeling member 46' of which at least a part can appropriately heat the heat sensitive tape is employed. As another alternative, as shown in FIG. 8, the peeling roll 46 may be replaced with a configuration in which a peeling bar 76 having a substantially triangular section including a heater 77 for the peeling tape 4 is mounted on the pivot arm 68. A case in which another member capable of attaching the peeling tape 4 thereon is employed in place of the peeling roll 46 is also included in the scope of the invention.

Although the invention has been shown and described with exemplary embodiments thereof, it should be understood, by those skilled in the art, that the foregoing and various other changes, omissions and additions may be made therein and thereto without departing from the scope of the invention.

The invention claimed is:

1. A peeling tape attaching apparatus for attaching a peeling tape on a surface protective film attached on a front surface of a wafer, comprising:
    a substantially horizontal movable table for supporting the wafer with the surface protective film pointing upward;
    a supply means for supplying the peeling tape onto the surface protective film placed on the wafer supported on the movable table;
    a peeling tape attaching means for attaching the peeling tape supplied from the supply means on the surface protective film;
    a pressing means for applying a pressing force by pressing the peeling tape attaching means against the surface protective film placed on the wafer via the peeling tape; and
    a pivot arm having a proximal end pivotable around a pivot shaft portion in a substantially vertical plane, and a forward end,
    wherein the peeling tape attaching means is attached to a lower portion of the forward end of the pivot arm,
    wherein the pressing means presses a roller on a portion of the pivot arm between the proximal end and the forward end to press the peeling tape attaching means against the surface protective film, and
    wherein the pressing means applies the pressing force when an end of the wafer is located under the peeling tape attaching means by the movable table, and the pressing force is canceled when the movable table moves toward another end of the wafer by a predetermined distance from the peeling tape attaching means.

2. A peeling tape attaching apparatus according to claim 1, wherein a gap is formed between the peeling tape attaching means and the surface protective film when the pressing force is canceled.

3. A peeling tape attaching apparatus according to claim 1 or 2, wherein the peeling tape attaching means is configured to attach the peeling tape to a ground back surface of the wafer opposite to the front surface.

4. A peeling tape attaching apparatus according to claim 1, wherein a width of the pivot arm perpendicular to the direction of movement of the movable table is smaller than, or substantially equal to, a width of the peeling tape.

5. A peeling tape attaching apparatus according to claim 1, further comprising a height adjusting means for adjusting a height of the peeling tape attaching means; and at least one of an input means for inputting a thickness of the wafer and a thickness of the surface protective film, and a height detection means for detecting a height of the peeling tape supplied from the supply means,
wherein the height adjusting means is configured to adjust the height of the peeling tape attaching means based on at least one of the thickness of the wafer and the thickness of the surface protective film input from the input means, and the height of the peeling tape detected by the height detection means.

6. A peeling tape attaching apparatus according to claim 1, further comprising a dicing tape attached on the back surface of the wafer and a lower surface of a mount frame to integrate the wafer with the mount frame, and a groove corresponding to a part of the dicing tape between the mount frame and the wafer on the top surface of the movable table.

7. A peeling tape attaching apparatus according to claim 1, wherein the pressing means is an air cylinder including a rod, a stroke end, and a stopper for stopping the rod before the stroke end.

* * * * *